(12) United States Patent
Sullivan et al.

(10) Patent No.: US 8,570,827 B2
(45) Date of Patent: Oct. 29, 2013

(54) PHYSICAL ORGANIZATION OF MEMORY TO REDUCE POWER CONSUMPTION

(75) Inventors: Steven C. Sullivan, Austin, TX (US); Abhijeet R. Tanpure, Austin, TX (US); William V. Miller, Austin, TX (US); Ben D. Jarrett, Austin, TX (US)

(73) Assignee: Apple Inc., Cupertino, CA (US)

( * ) Notice: Subject to any disclaimer, the term of this patent is extended or adjusted under 35 U.S.C. 154(b) by 372 days.

(21) Appl. No.: 13/164,306

(22) Filed: Jun. 20, 2011

(65) Prior Publication Data

US 2012/0155210 A1    Jun. 21, 2012

Related U.S. Application Data

(60) Provisional application No. 61/425,115, filed on Dec. 20, 2010.

(51) Int. Cl.
*G11C 8/08*    (2006.01)
(52) U.S. Cl.
USPC ............ 365/230.06; 365/230.04; 365/230.03; 365/230.02; 365/189.05; 365/189.02; 365/49.1; 365/229; 365/227

(58) Field of Classification Search
USPC ............ 365/189.02, 189.15, 189.05, 230.02, 365/230.04, 230.03, 230.06, 49.1, 229, 227, 365/226
See application file for complete search history.

(56) References Cited

U.S. PATENT DOCUMENTS

| | | | |
|---|---|---|---|
| 5,568,442 A | 10/1996 | Kowalczyk et al. | |
| 6,838,901 B2 * | 1/2005 | Sakata et al. | 326/34 |
| 7,193,925 B2 * | 3/2007 | Hong | 365/230.06 |
| 7,443,759 B1 | 10/2008 | Rowlands et al. | |
| 7,466,620 B2 * | 12/2008 | Mohammad et al. | 365/230.06 |
| 2007/0153584 A1 | 7/2007 | Mohammad et al. | |

* cited by examiner

*Primary Examiner* — Andrew Q Tran
(74) *Attorney, Agent, or Firm* — Stephen J. Curran; Meyertons, Hood, Kivlin, Kowert & Goetzel, P.C.

(57) ABSTRACT

Controllable arrays in a memory may be activated and deactivated independently. In one embodiment, a processor may include a memory. The memory may be a de-interleaved memory with independently selectable arrays. Based on an address bit of an address used to access data from the memory, a wordline and downstream components may be activated while another wordline and downstream components may be deactivated.

20 Claims, 13 Drawing Sheets

PHYSICAL ORGANIZATION OF MEMORY TO REDUCE POWER CONSUMPTION

PRIORITY INFORMATION

This application claims benefit of priority of U.S. Provisional Application Ser. No. 61/425,115 entitled "Cache Memory Organization and Architecture Including a Late Arriving Read Physical Address" filed Dec. 20, 2010, the content of which is incorporated by reference herein in its entirety.

BACKGROUND

1. Technical Field

This disclosure relates to processors, and more particularly to memory.

2. Description of the Related Art

Most processors today use a cache memory to increase efficiency of memory accesses and to reduce the time to fetch instructions or data from a system memory. As processor speeds increase, cache access time becomes increasingly more important. Moreover, for a cache memory read access that misses in the translation lookaside buffer (TLB), at least a portion of the virtual address (VA) is converted to a physical address (PA) to access the cache. The translation process takes a non-trivial amount of time. In some cases, portions of the physical address (e.g., some PA bits) may arrive later than other portions of the PA/VA. This can be problematic in some cache architectures.

Further, cache array design may be a significant factor in the overall design area required to implement an integrated circuit, as well as its operating frequency and power consumption. Mobile processor applications may be particularly sensitive to power consumption issues, in that power consumption is ordinarily directly related to battery life. Improving the power efficiency of cache arrays may improve a processor's overall power consumption.

SUMMARY

This disclosure describes techniques and structures that facilitate activating and deactivating a wordline (and corresponding array) of a memory. In one embodiment, a memory (e.g., a cache memory, a static random-access memory (SRAM), etc.) is disclosed that includes a first array including a number of first wordline drivers and a second array including a number of second wordline drivers. The first wordline drivers may be configured to receive a first enable signal and the second wordline drivers may be configured to receive a second enable signal. Each of the enable signals may be active mutually exclusive and may be derived from an address bit of an address used to access the memory. In response to receiving an asserted enable signal, the respective wordline and array may be activated to output a line of data. In some embodiments, the non-enabled, non-activated wordline and array may be shut down into a low power mode resulting in power savings without suffering performance loss.

DETAILED DESCRIPTION OF EMBODIMENTS

Figure 1:
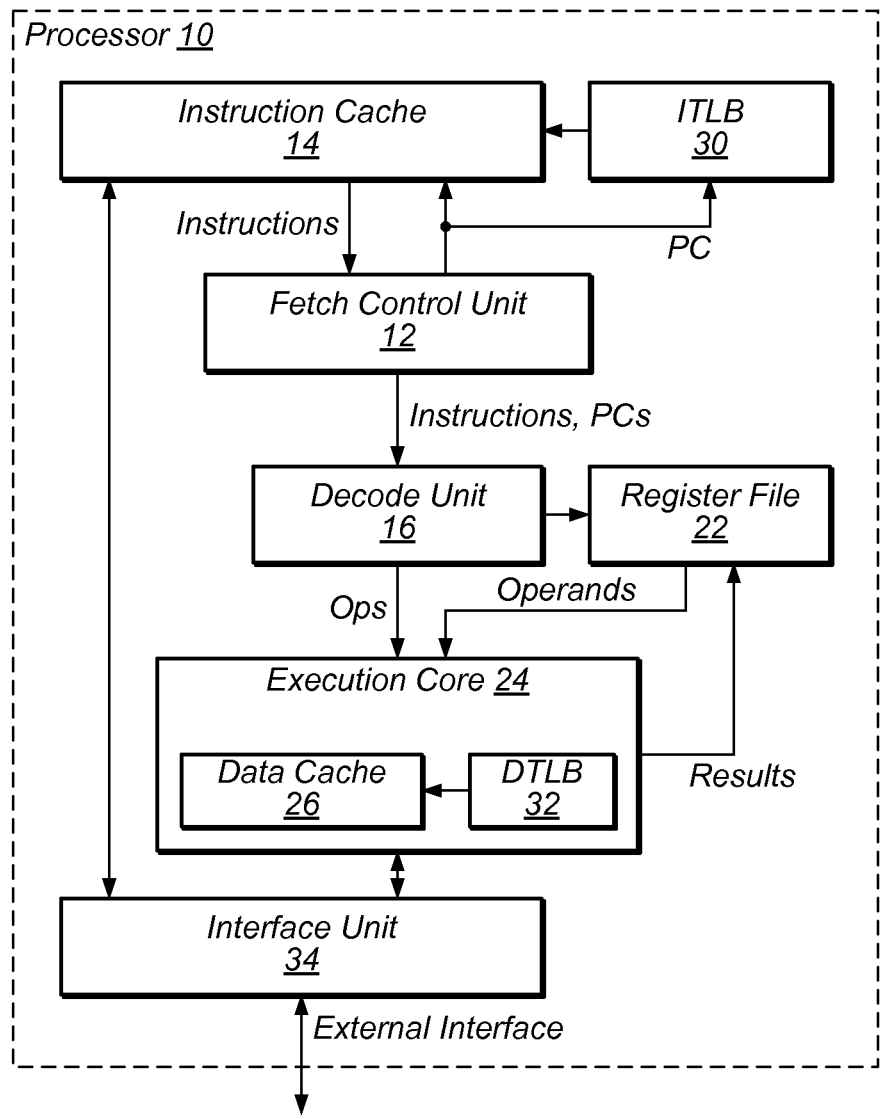
FIG. 1 is a block diagram of one embodiment of a processor that includes a memory.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units...." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

"First," "Second," etc. As used herein, these terms are used as labels for nouns that they precede, and do not imply any type of ordering (e.g., spatial, temporal, logical, etc.). For example, in a memory having a plurality of sense amplifiers, the terms "first" and "second" sense amplifiers can be used to refer to any two of the sense amplifiers. In other words, the "first" and "second" sense amplifiers are not limited to logical sense amplifiers 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

In the following discussion, a de-interleaved memory configuration is disclosed that allows for the independently selectable arrays to be activated or deactivated resulting in power savings without loss of performance. The disclosure first describes an exemplary processor that includes one or more memories, followed by a description of array and wordline activation/deactivation that may be implemented in one embodiment of the memory. For simplicity of explanation and ease of understanding, the following figures and accompanying description detail a cache memory as one example of a memory that may utilize the disclosed techniques and structures. It is understood that other memory, for example, static random-access memory (SRAM), etc., may also benefit from the disclosed techniques and structures.

Processor Overview

Turning now to FIG. 1, a block diagram of one embodiment of a processor 10 is shown. In the illustrated embodiment, processor 10 includes fetch control unit 12, instruction cache (ICache) 14, decode unit 16, register file 22, execution core 24, and interface unit 34. Fetch control unit 12 is configured to provide a program counter address (PC) for fetching from instruction cache 14. Instruction cache 14 is configured to provide instructions (with PCs) back to fetch control unit 12 to be fed onto decode unit 16. Decode unit 16 is configured to provide decoded instruction operations (ops) to execution core 24. Decode unit 16 is coupled to register file 22, which is configured to provide operands for execution to execution core 24. Register file 22 is configured to provide operands to execution core 24, and is configured to receive results to be written to register file 22 from execution core 24. Execution core 24 is coupled to interface unit 34, which is coupled to an external interface of processor 10.

Instruction cache 14 may include control logic and memory arrays. The memory arrays may be used to store the cached instructions to be executed by processor 10 and the associated cache tags. Instruction cache 14 may have any capacity and construction (e.g. direct mapped, set associative, fully associative, etc.). Instruction cache 14 may include any cache line size. It is contemplated that processor 10 may implement any suitable instruction set architecture (ISA), such as ARM™, PowerPC™, or x86 ISAs, combinations thereof, etc.

In some embodiments, processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, instruction cache 14 may be partially or completely addressed using physical address bits rather than virtual address bits. For example, instruction cache 14 may use virtual address bits for cache indexing and physical address bits for cache tags.

To avoid the cost of performing a full memory translation when performing a cache access, processor 10 may store a set of recent and/or frequently-used virtual-to-physical address translations in a translation lookaside buffer (TLB), such as instruction TLB (ITLB) 30. During operation, ITLB 30 (which may be implemented as a cache, as a content addressable memory (CAM), or using any other suitable circuit structure) may receive virtual address information (not shown) and determine whether a valid translation is possible. If so, ITLB 30 may provide the corresponding physical address bits to instruction cache 14. If not, ITLB 30 may cause the translation to be terminated, for example by raising a virtual memory exception.

In one embodiment, the logic associated with ITLB 30 may translate at least a portion of the VA to one or more PA bits. For example, some number of the lower order VA bits (e.g., VA[11:0]) may also be the same as the corresponding PA lower order bits. As a result, those bits may not need translation and may thus be forwarded to the cache tag and data arrays. However, the translated PA bits may take longer to generate and may be forwarded later than the lower order bits. As described in greater detail below, in one embodiment one or more of the PA bits (e.g., PA[12]) may be forwarded in the clock cycle after the VA bits are forwarded. In addition, in one embodiment the later arriving PA bits may be used to generate one or more sense amplifier enable signals for use by the sense amplifiers the output of the cache arrays, such as instruction cache 14 and/or data cache 26. This enable signal, when deactivated, may allow the sense amplifiers to be disabled or deactivated and remain disabled longer than conventional cache memories that use a multiplexer (mux) to select an output of always enabled sense amplifiers of the arrays. In another embodiment, the later arriving PA bits may be used to generate a signal to enable and disable a wordline driver within a particular array block of the cache, thereby allowing an array configuration in which only one smaller array block is active at a given time for a given access. As a result, a simple logic gate such as NOR-gate (shown in FIG. 9) or tri-state (shown in FIG. 10) may be used at the output of the arrays.

Decode unit 16 may generally be configured to decode the instructions into instruction operations (ops). Decode unit 16 may also be configured to schedule each instruction and provide the correct register values for execution core 24 to use.

Execution core 24 may perform the operations (e.g., MOV, ADD, SHIFT, LOAD, STORE, etc.) indicated by each instruction.

In the illustrated embodiment, execution core 24 includes data cache 26, which may be a cache memory for storing data to be processed by the processor 10. Like instruction cache 14, data cache 26 may have any suitable capacity, construction, or line size (e.g. direct mapped, set associative, fully associative, etc.). Moreover, data cache 26 may differ from the instruction cache 14 in any of these details. As with instruction cache 14, in some embodiments, data cache 26 may be partially or entirely addressed using physical address bits. Correspondingly, data TLB (DTLB) 32 may be provided to cache virtual-to-physical address translations for use in accessing data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

Register file 22 may generally include any set of registers usable to store operands and results of ops executed in processor 10.

Interface unit 34 may generally include the circuitry for interfacing processor 10 to other devices on the external interface. The external interface may include any type of interconnect (e.g. bus, packet, etc.). The external interface may be an on-chip interconnect, if processor 10 is integrated with one or more other components (e.g. a system on a chip configuration). The external interface may be on off-chip interconnect to external circuitry, if processor 10 is not integrated with other components. In various embodiments, processor 10 may implement any instruction set architecture.

TLB and Cache

Figure 2:
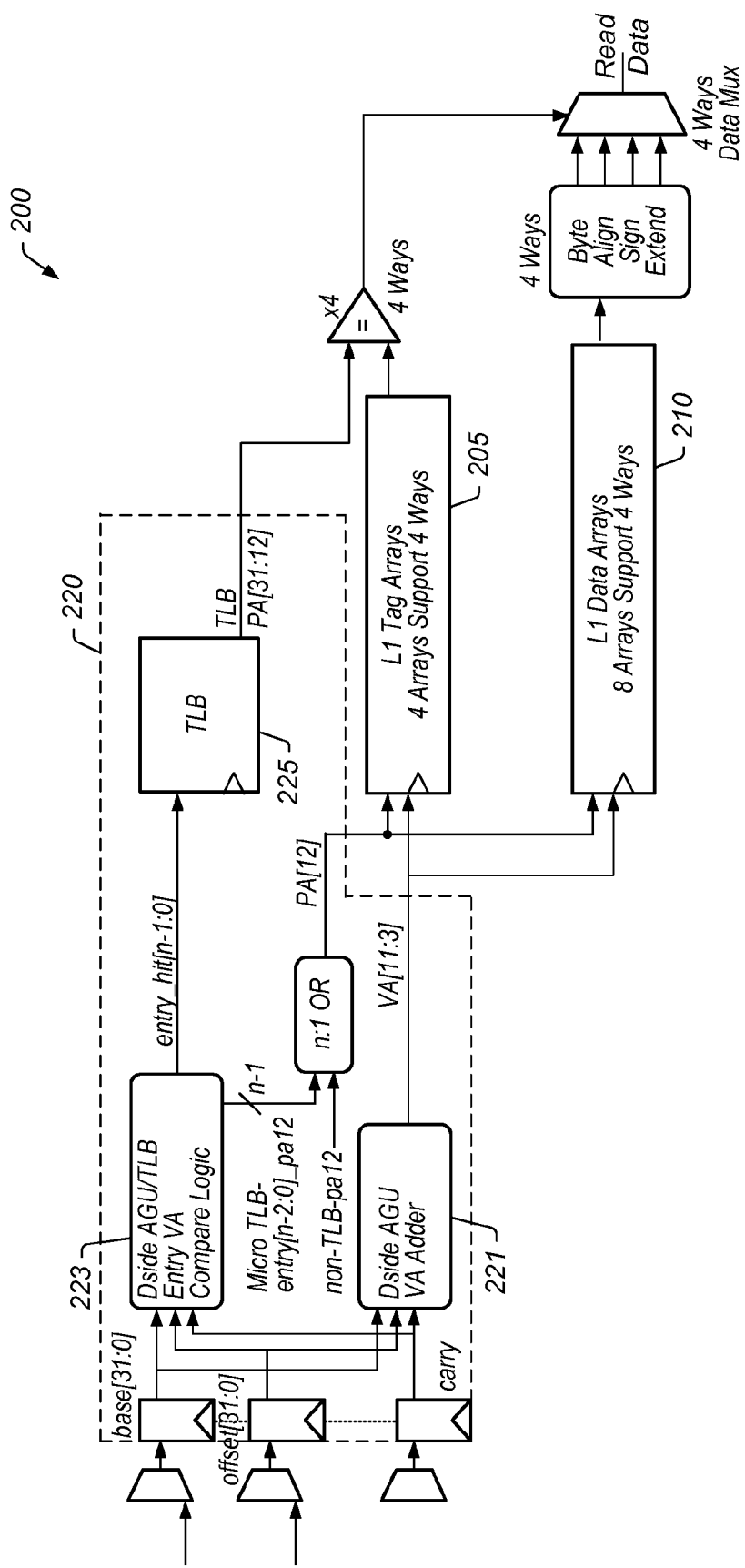
FIG. 2 is a block diagram of one embodiment of a memory and associated access logic.

Turning to FIG. 2, a block diagram of one embodiment of a cache memory (e.g., a data cache or instruction cache) and associated access logic is shown. Circuit 200 includes various multiplexers which may provide a base address and an offset to TLB logic 220. TLB logic 220 may include latches, which may be configured to capture the base address and the offset. TLB logic 220 may further include address generation unit 221 and an address generation and compare unit (AGCU) 223 that may determine whether a corresponding entry exists in TLB 225. In addition, AGCU 223 may provide partially decoded Micro-TLB Entries [n-2:0] PA bits, which may be used in the generation of one or more physical address bits, such as a physical address bit (e.g., PA [12]). Circuit 200 may also include L1 tag array 205 and L1 data array 210, as well as various other logic to select the correct path.

As mentioned above, virtual address bits (e.g., VA [11:3]) may be provided to tag array 205 and data array 210 early in a first clock cycle, while one or more other bits (e.g., PA [12]) may take longer to generate. Thus, before tag array 205 and data array 210 may be accessed, the PA [12] bit may be clocked into them, which may require a longer clock cycle and reduced performance. In the illustrated embodiment, the data array is a four-way cache, such that the data for the four ways may be output to the data mux.

Figure 3:
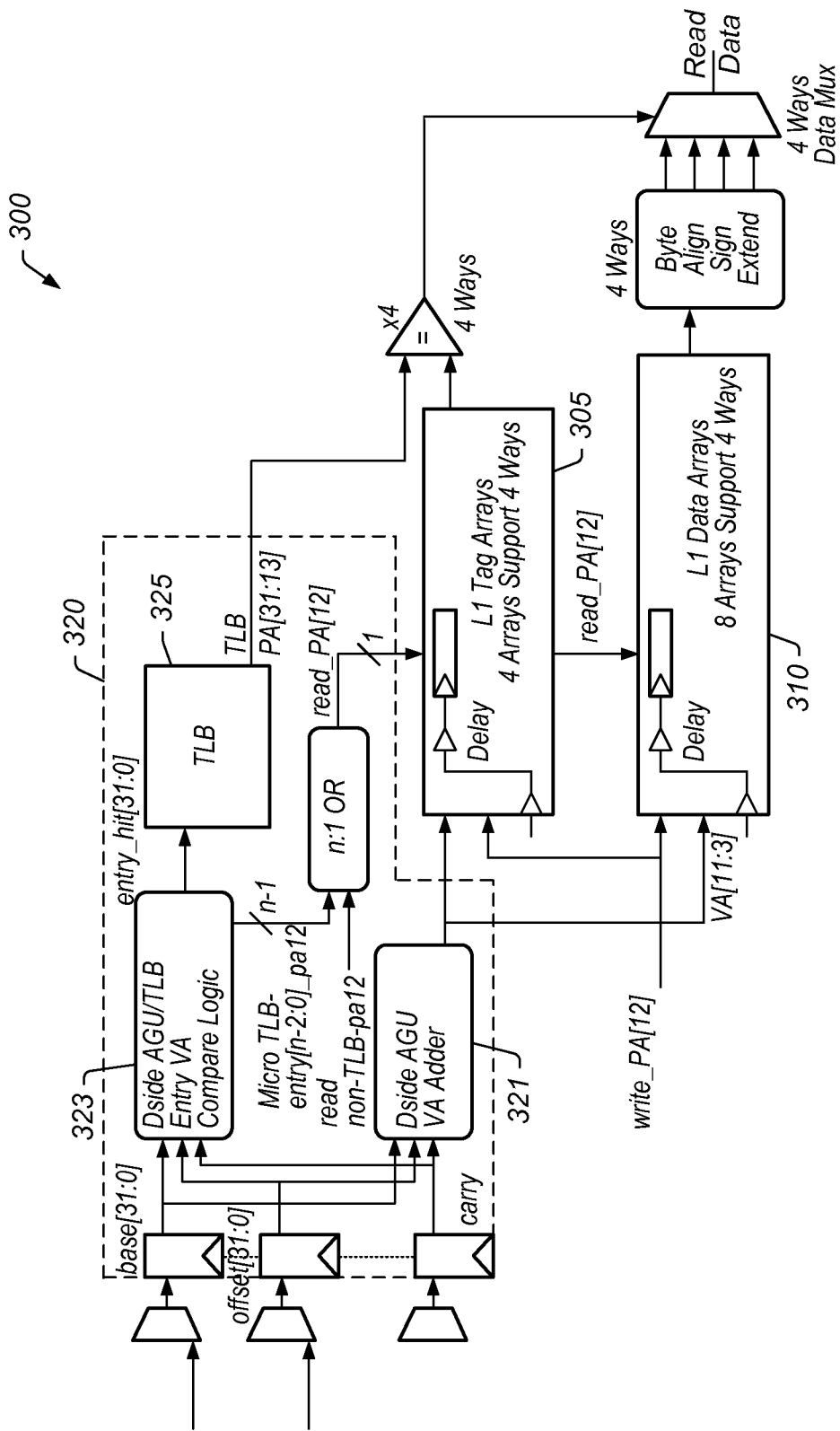
FIG. 3 is a block diagram of another embodiment of a memory and associated access logic.

Turning to FIG. 3, a block diagram of another embodiment of a data cache and associated access logic is shown. Circuit 300 includes various multiplexers that provide a base address and an offset to TLB logic 320. TLB logic 320 may include latches, which may capture the base address and the offset. TLB logic 320 may further include address generation unit 321 which may provide virtual address bits (e.g., [11:3]) and an address generation and compare unit (AGCU) 323 that may determine whether a corresponding entry exists in TLB 325. In addition, AGCU 323 may provide partially decoded Micro-TLB Entries [n-2:0] PA bits, which may be used in the generation of one or more physical address bits for reads, such as read_PA [12]. Circuit 300 may also include L1 tag array 305 and L1 data array 310, as well as various other logic to select the correct path.

As mentioned above, some virtual address bits (e.g., VA [11:3]) may be provided to tag array 305 and data array 310 in a first clock cycle, while one or more physical address bits (e.g., PA [12]) may take longer to generate. However, in contrast to the embodiment described at FIG. 2, the VA [11:3] bits may be provided to tag array 305 and data array 310 in a first clock cycle. Then some delay time into the next clock cycle, an n:1 reduction tree, or n:1 OR, may provide the read_PA [12] bit to tag array 305 and data array 310. In low frequency operation modes, read_PA[12] may still arrive in the same clock cycle as the virtual address bits. As illustrated further below in FIGS. 4-6, the late arriving read_PA [12] may be clocked or latched in after a delay of some time relative to the rising edge of the clock. The resulting read_PA_reg[12] may be used to generate one or more sense amp enable signals or wordline enable signals.

Figure 4:
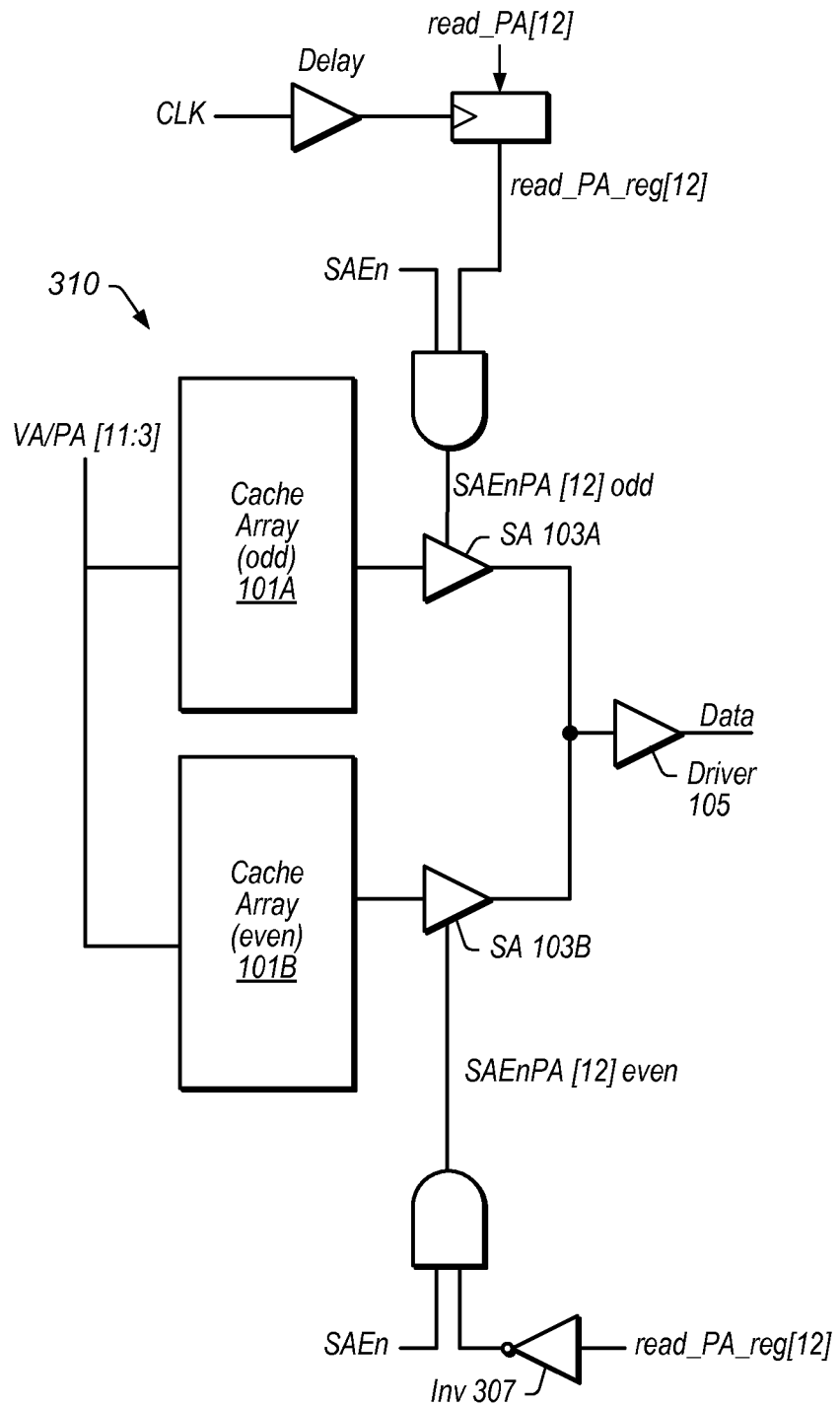
FIGS. 4-6 are block diagrams of various embodiments of an output selection circuit of a memory array.

Referring to FIG. 4, a block diagram of one embodiment of an output selection circuit of the cache memory of FIG. 3 is shown. As described herein, other memories, such as an SRAM, may utilize a similar output selection circuit as shown in FIG. 4. In one embodiment, circuit 310 may include cache array 101A (odd) and cache array 101B (even). The output of each array is coupled to a respective sense amplifier SA103A and SA103B. Then the sense amps are collectively coupled to an input of driver 105. The sense amp enable for sense amp SA103A is SAEnPA[12] odd, which may be an output of SAEn AND'd with read_PA_reg[12], while the sense amp enable for sense amp SA103B is SAEnPA[12] even, which may be an output of an inverted read_PA_reg[12] AND'd with SAEn. Therefore, three states may exist, one in which SAEnPA[12] odd is enabled and SAEnPA[12] even is disabled, another in which SAEnPA[12] odd is disabled and SAEnPA[12] even is enabled, and a third in which both SAEnPA[12] odd and SAEnPA[12] even are both disabled. As such, the enable signals may be active mutually exclusive. Active mutually exclusive is used herein to mean that both signals may not be active at the same time; therefore, if two signals are active mutually exclusive, either one may be enabled or both may be disabled. As shown, logic may generate the actual sense amp enable signals. As described above, the SAEn and read_PA_reg [12] signals may be input to an AND-gate to form the SAEnPA[12] odd signal while the SAEn and inverted read_PA_reg[12] signals may be input to an AND-gate to form the SAEnPA[12] even signal. Thus, in some embodiments, each respective sense amp enable signal may be derived from an address bit (e.g., read_PA[12]) of an address used to access the memory. Components of the late select sense amp enable, such as AND-gates, drivers, and any inverters or buffers, and corresponding structural equivalents may be referred to as "means for selecting a sense enable output."

When the VA/PA [11:3] signals arrive, the wordlines in both arrays may select (cache) lines (of data) from each of the arrays. The wordlines in both arrays, in various embodiments, may receive the same address bits to access the respective cache lines. For instance, if VA/PA [11:3] are used to access the cache line of a first array, then the same VA/PA [11:3] bits may be used to access the cache line of a second array. However, the cache line of data corresponding to those address bits in the first cache array may be different than the cache line of data corresponding to those address bits in the second cache array. In some embodiments, the late arriving address bit (e.g., a late arriving physical address bit, such as read_PA[12]) may arrive early enough in a clock cycle to disable one of the sense amps in the pair of sense amps shown in FIG. 4. Thus, the late arriving bit, and therefore late arriving sense amp enable may be after the start of a clock cycle in which data is read from the cache memory. The sense amplifiers may be configured to receive their respective late arriving sense enable signals after the start of a clock cycle in which data is read from the cache memory early enough to deactivate or disable one of the sense amplifiers, thereby saving power.

At some point in time later (shown in FIG. 7), only one of the sense amps SA103A or SA103B may be enabled dependent on the value of address bit (e.g. read_PA [12]) used to generate the enable signals, and the data from the selected cache array and respective enabled, activated sense amp may be output through driver 105. For example, the selected cache line may be output to an execution core of the processor. Along the same lines, the disabled or deactivated sense amp may not output a cache line of data. In this way, only one sense amp may be activated at any given time. The other sense amp may be disabled/deactivated and operate in a standby mode, or low power mode. A low power mode may consume a very small, negligible amount of power (e.g., 1 nA). Although not shown, there may be many sense amps for each array. Thus the savings in power by disabling non-active sense amps may be significant.

In various embodiments, the late select sense amplifier enable signals based on a late arriving address bit may be implemented in a data cache as well as in an instruction cache. In some embodiments, the late select sense amplifier enable signals may be implemented in one type of cache and not the other, for instance, it may be implemented in a data cache and not in an instruction cache.

For subsequent cache memory reads, the late select sense enable may occur in similar fashion. For example, consider a first cache memory read in which a first array and second array of a cache memory receive a portion of an address (e.g., VA/PA [11:3]) used to access the cache memory before the start of a first clock cycle. The first array may provide a first cache line of data to a first sense amplifier and the second array may provide a second cache line of data to a second sense amplifier. After the start of the clock cycle, the first sense amp may receive a first sense enable signal and the second sense amp may receive a second sense enable signal. Each of the first and second sense enable signals may be derived from another portion of the address (e.g., PA[12], PA[13], etc.) used to access the cache memory, and may be active mutually exclusive. Thus, one of the enable signals may be asserted and the other may be deasserted. For example, the first enable signal may be asserted and the cache line from the first array and first sense amp may be output. In a next clock cycle, the second sense amp may be activated while the first sense amp may be deactivated resulting in the second sense amp outputting the respective cache line from the second array. In various embodiments, the disabled sense amp may be re-enabled after the end of a read cycle, for example, based on a timer or clock. Or in some embodiments, the disabled sense amp may be disabled until it receives an asserted sense enable signal. Thus, if four consecutive reads assert and activate the first sense amp, the second sense amp may remain disabled the entire time until it receives an asserted enable signal in which case the second sense amp may be activated in response to the asserted second sense enable signal, according to some embodiments.

read_PA[12] may arrive before the start of the clock cycle as well but the respective signals may be received by the sense amplifiers after the start of the clock cycle. In some embodiments, the late arriving bit may not arrive late at all and may arrive at approximately the same time as other address bits. Or, in some embodiments, the respective signals may also be received before the start of the clock cycle. For instance, in some embodiments, the late arriving bit may arrive early enough in time such that the entire wordline may be shut down, as described in more detail at FIGS. 8-10 and 12. As such, more power savings may be achieved by going to a low power mode for the wordlines, bitlines, sense amps, and other logic. As a result, components downstream of the wordlines may be preempted resulting in no switching in the shut down array, which may yield significant power savings. In various embodiments, there may be multiple late arriving bits of the address used to access the cache. In such embodiments, some late arriving bits may arrive early enough to shut down the wordlines and downstream components while others may arrive later such that the wordline may not be disabled but one or more sense amp enables may be disabled.

Figure 5:
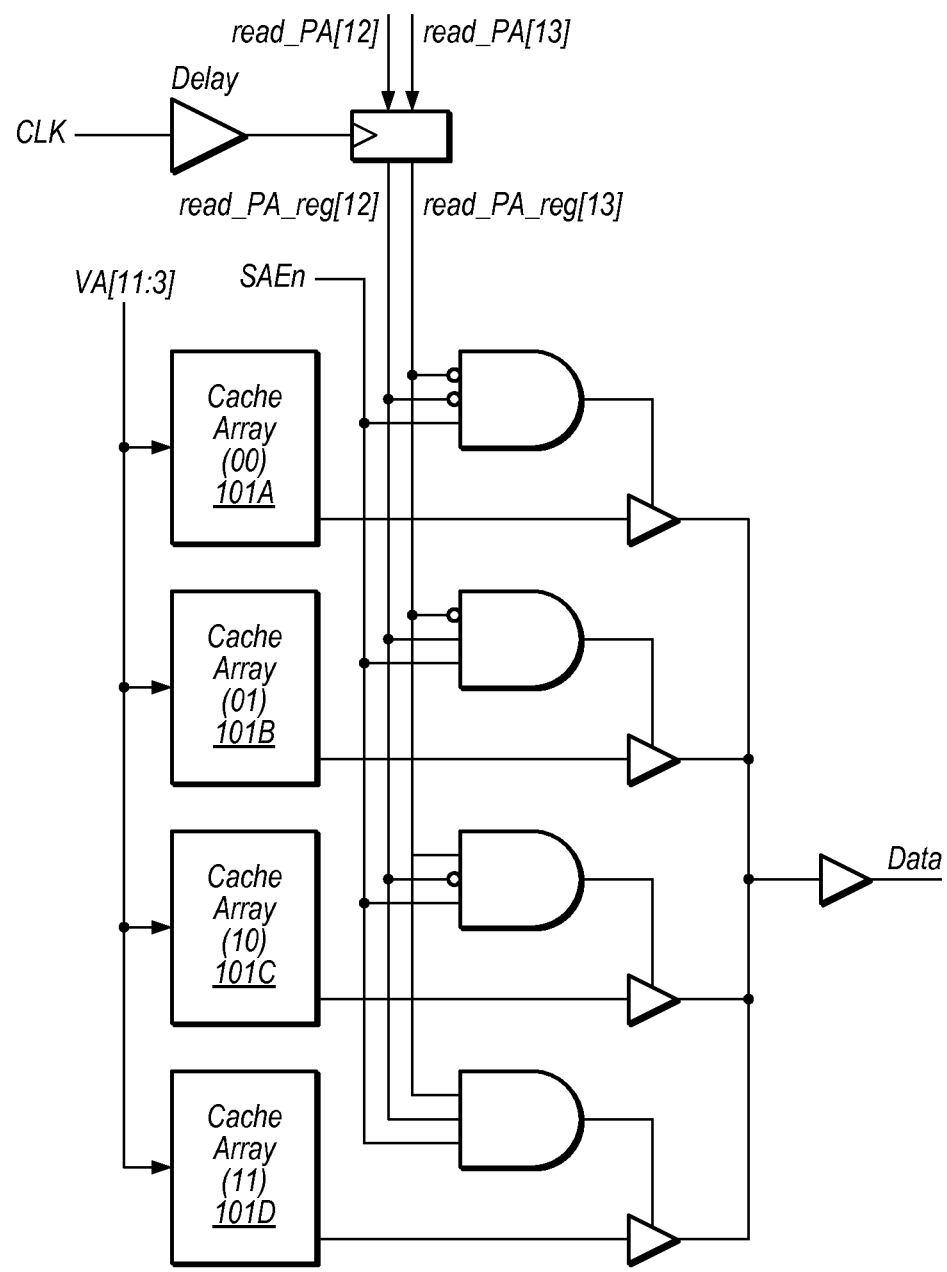

FIG. 5 illustrates a block diagram of another embodiment of an output selection circuit of the cache memory of FIG. 3. In the illustrated embodiment, multiple late arriving bits (e.g., read_PA[13:12]) can be decoded according to the disclosed techniques. The decoding of the multiple late arriving bits can be decoded similarly to the embodiment of FIG. 4. Note, as shown, that additional logic may be present in the embodiment of FIG. 5 (e.g., additional NAND gates, etc.). The illustrated embodiment shows two late arriving bits but more than two late arriving bits is also envisioned such that the other late arriving bits can also be decoded in a similar fashion.

Figure 6:
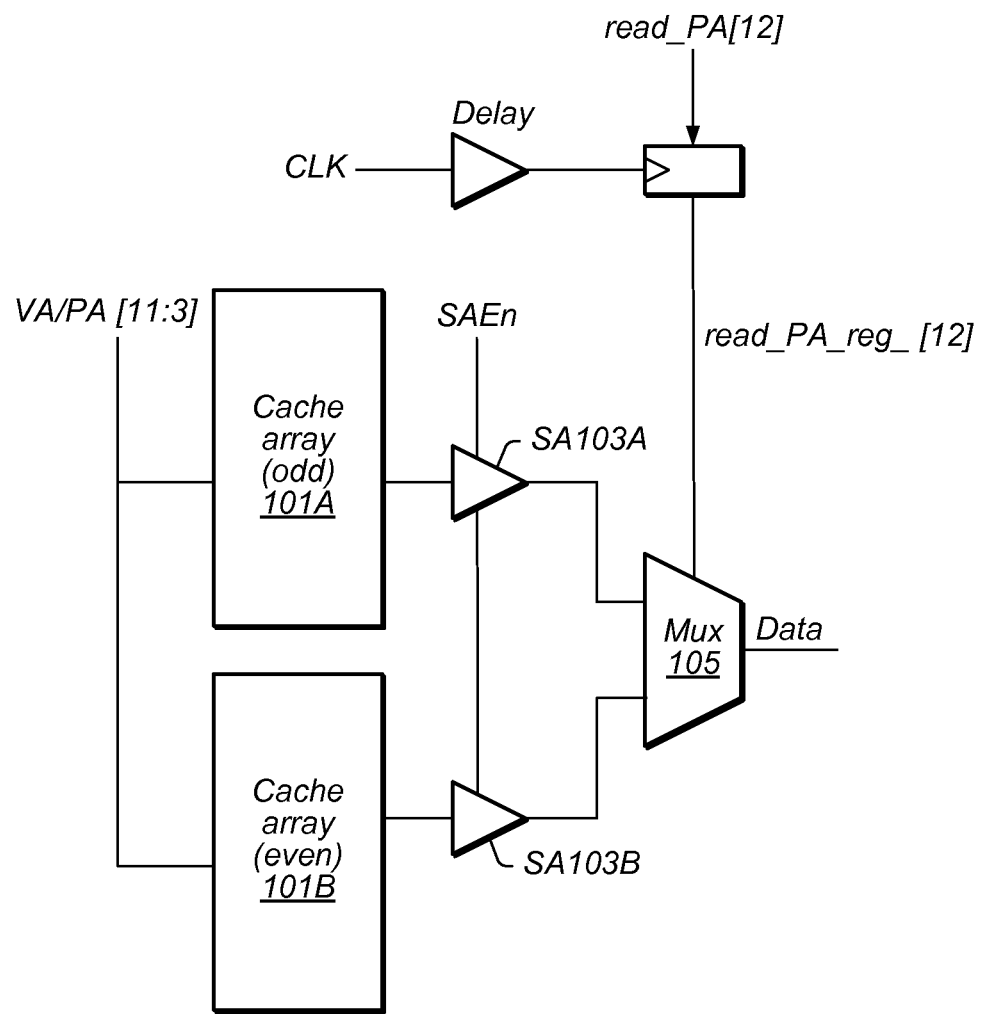

Referring to FIG. 6, a block diagram of another output selection circuit of the cache memory of FIG. 3 is shown. In the illustrated embodiment, the late address bits (e.g., read_PA[12]) arrive so late that one of the sense amps may not be disabled when operating at full speed. In such instances, a last state mux 105 may replace the final buffer stage. This approach may allow for the latest possible arrival time of the address bits at the expense of using more power and adding delay to the clk-to-q read data path. Circuit 310 includes a cache array 101A (odd) and a cache array 101B (even). The output of each array may be coupled to a respective sense amplifier SA103A and SA 103B. The output of each sense amp may be coupled to an input of mux 105. Each sense amp may also be coupled to an enable signal SAEn, which may be used to enable and activate the sense amps. An address (e.g., VA/PA [11:3]) may used to access each of arrays 101A and 101B, while another bit (e.g., PA [12]) may be used to select an output of one of the sense amp outputs. Accordingly, in the illustrated embodiment, when an address is provided to circuit 210, both sense amps 101A and 101B may enabled, and the PA [12] bit may select the appropriate sense amp output.

By allowing for a late select sense amplifier to take advantage of a late arriving bit of an address to used access a memory, the lateness of that bit may allow for one or more sense amplifiers to be disabled resulting in power savings without suffering performance consequences or further delays as a result of a late arriving bit.

Figure 7:
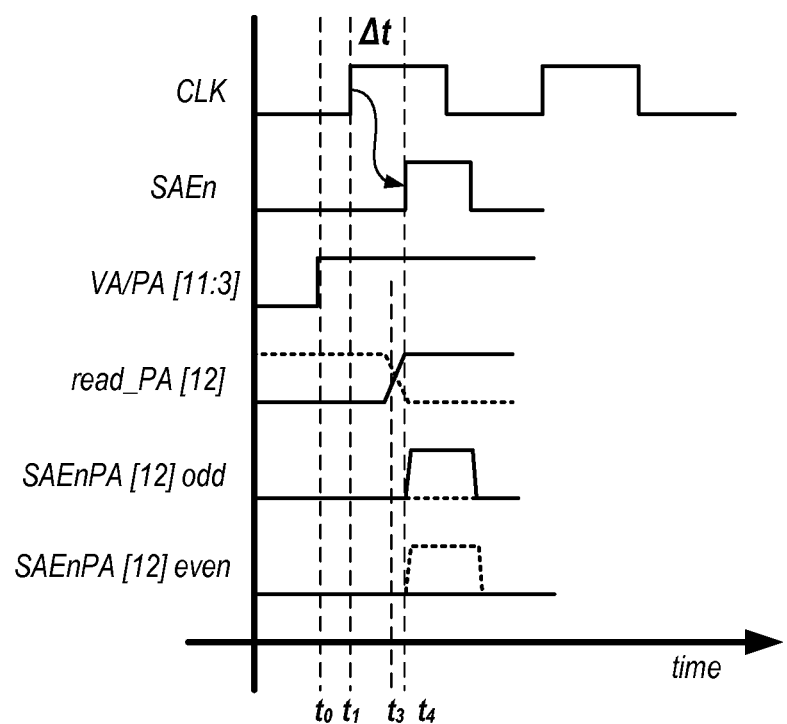
FIG. 7 is a timing diagram depicting example circuit timing of the embodiments shown in FIGS. 4-5.

For ease of understanding, the following discussion will be based on the embodiment illustrated in FIG. 4, unless otherwise noted. Turning to FIG. 7, a timing diagram is shown depicting example timing of control signals in the embodiments of FIGS. 3 and 4. The depicted timing diagram includes the following signals: CLK, SAEn, VA/PA [11:3], read_PA [12], SAEnPA [12] odd, and SAEnPA [12] even. As shown, the CLK signal is a free-running clock. The SAEn signal is an overall sense amp enable signal, which was used to enable both sense amps SA 103A and SA 103B in FIG. 6 and which was used along with PA[12] to generate SAEnPA [12] odd and SAEnPA [12] even in FIG. 4. The VA/PA [11:3] signal represents the lower order virtual/physical address bits [11:3]. The read_PA [12] signal is a physical address bit [12] for reads. The SAEnPA [12] odd signal is used to turn on and off the sense amp SA103A of FIG. 4, and the SAEnPA [12] even signal is used to turn on and off the sense amp SA103B of FIG. 4. Note in FIG. 7 that when SAEn is low, neither sense amp is enabled.

As shown, the PA/VA [11:3] arrives at time $t_0$ before the rising edge or start of a clock cycle, and the read_PA [12] signal arrives during that clock cycle at time $t_3$. Note that in various embodiments, read_PA[12] may likewise arrive before the start of the clock cycle. After a delay Δt from the rising edge of CLK at $t_1$, the SAEn signal is asserted. In FIG. 6, this would cause both sense amps SA 103A and SA 103B to turn on, and the read_PA_reg [12] signal would be usable to select the mux output. However, as shown in FIG. 4, the read_PA_reg [12] signal and the SAEn signal are used to generate the SAEnPA[12] odd signal and a SAEnPA[12] odd signal, which are active mutually exclusive.

As shown in FIG. 4, by AND'ing the SAEn signal with read_PA_reg [12] to form the SAEnPA[12] odd signal and by AND'ing the SAEn signal with read_PA_reg [12] inverted to form the SAEnPA [12] even signal, the mux of FIG. 6 may be removed and the outputs of the two sense amps may be coupled together. This may allow one sense amp to be enabled at any given time and the other sense amp to be disabled resulting in power savings.

Memory Configuration

Figure 8:
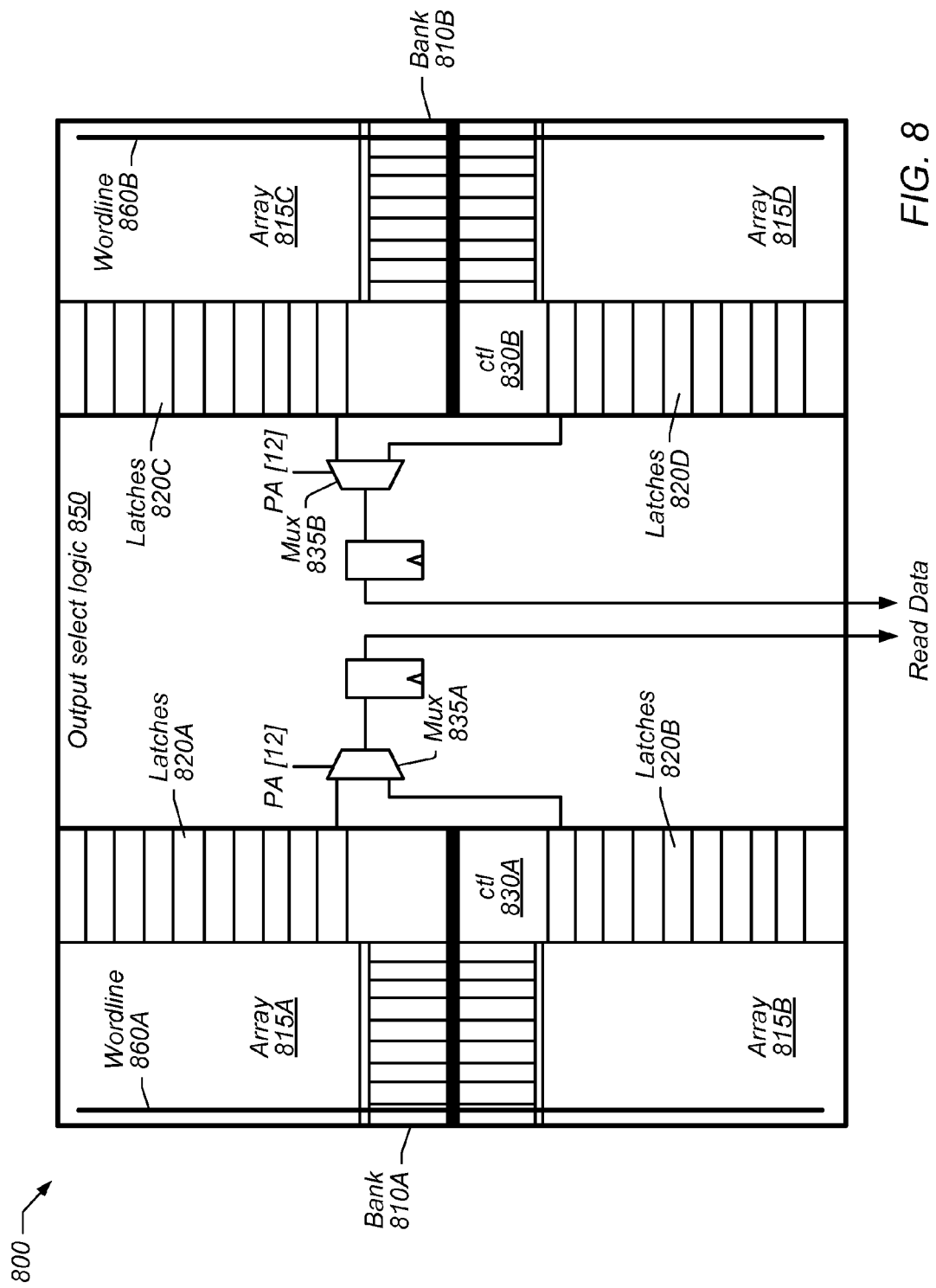
FIGS. 8-10 are block diagrams of various embodiments of a memory configuration.

Turning to FIG. 8, a block diagram of one embodiment of a cache memory configuration is shown. Cache memory 800 includes a pair of memory banks (e.g., 810A and 810B, separated by output select logic 850.

In the illustrated embodiment, each bank 810 includes one or more memory arrays (e.g., 815A-815D), a number of latches (e.g., 820A-820D), wordlines (e.g., 860A-860B), and a control logic block (e.g., 830A-830B). As shown, each bank is arranged vertically such that bank 810A includes array 815A and 815B, control block 830A, and latches 820A and 820B, and wordline 860A. Likewise for bank 810B.

In one embodiment, banks 810A and 810B may be arranged in an interleaved manner. For example, bank 810B may be arranged in an interleaved manner such that sequential cache line addresses map alternating between array 815A and array 815B. The lower order addresses (e.g., [11:3]) may therefore select two cache lines, one in each array 815, and the PA [12] address bit may be used to select between the two cache lines using the mux 835A and 835B.

Accordingly, during a read access to bank 810A, the wordline 860A may be active across both arrays 815A and 815B. Once the wordline driver turns on a particular column, all the bitlines of that column may be actively driving and consuming power. When the PA [12] bit arrives, the appropriate cache line may be selected via mux 835A, and the appropriate read data may become available.

Figure 9:
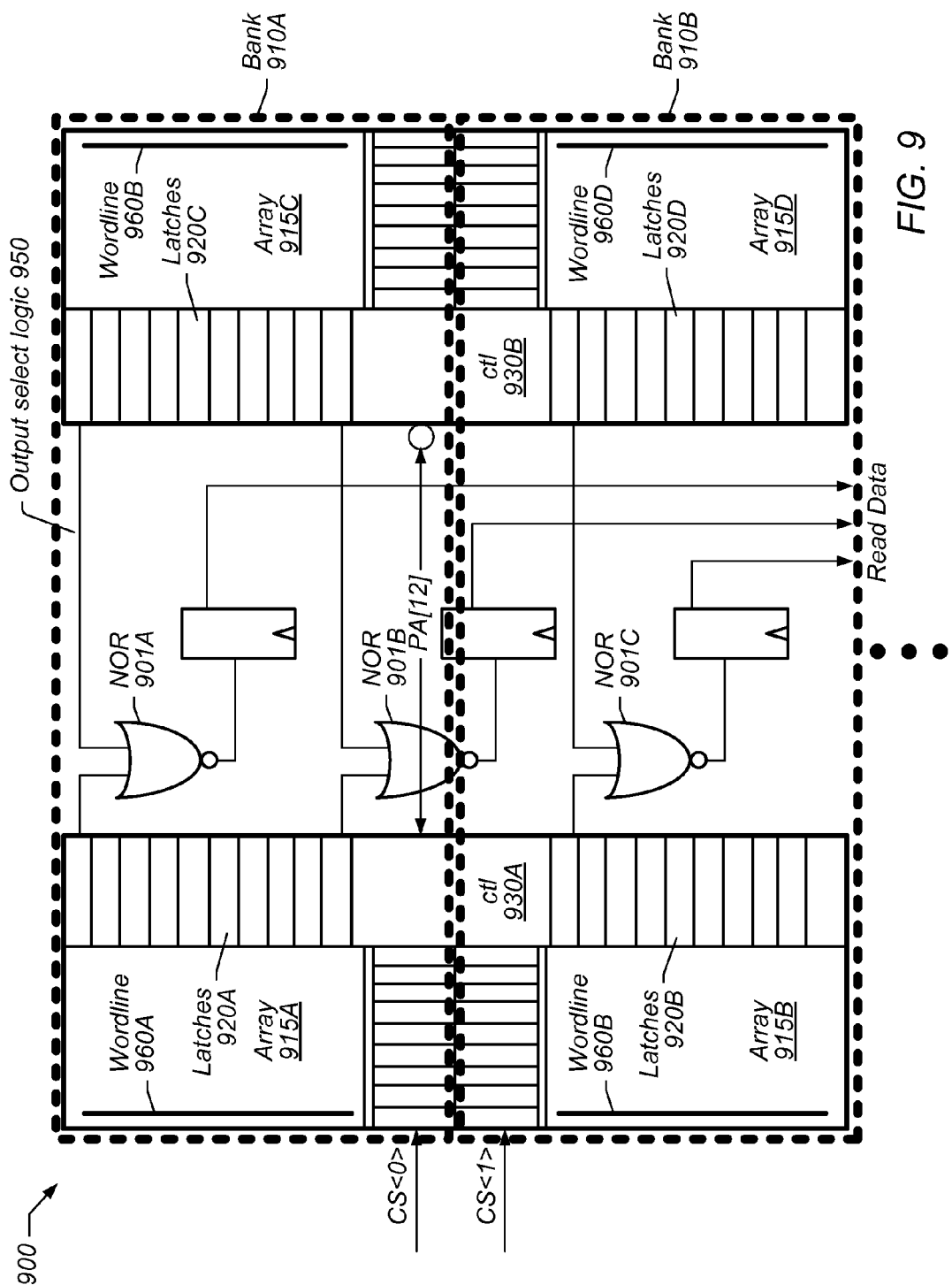
Figure 10:
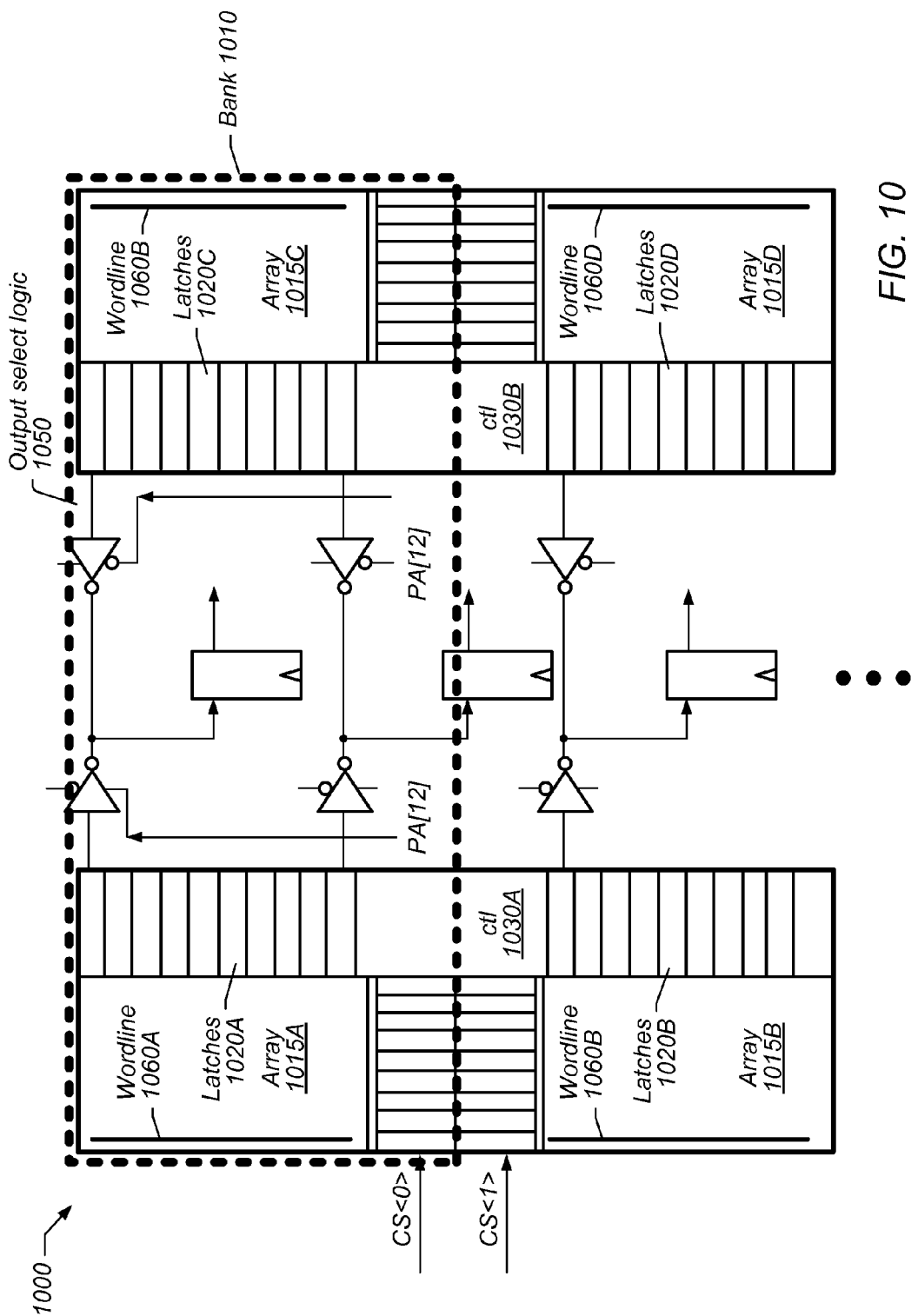

Referring to FIGS. 9-10, block diagrams of other embodiments of a cache memory configuration are shown. Other memory, for example, SRAM may also be configured in a similar manner as shown in FIGS. 9-10. Cache memory 900 may include a pair of memory banks (e.g., 910A and 910B) and output select logic 950. However, in contrast to the memory banks shown in FIG. 8, the memory banks in FIGS. 9-10 may be de-interleaved and arranged horizontally. Thus, as shown, one array may be an odd array while the other array may be an even array of a previously interleaved single array. In addition, output select logic 950 (and 1050) is different than the output select logic of FIG. 8. Cache memory 1000 and associated cache components of FIG. 10 are similar to that of FIG. 9 except for output select logic 1050, which will be described in more detail below.

In the illustrated embodiment, horizontally arranged bank 910A includes memory arrays 915A and 915C, latches 920A and 920C, wordlines 960A and 960C, and portions of control logic blocks 930A and 930B. In this arrangement, the banks are no longer interleaved, and because each array has separate wordline 960 and drivers, the arrays may be independently controllable. The PA[12] address bit or an enable signal derived from PA [12] is used to activate the wordline driver of the active array. As shown, the enables for the two wordlines/arrays are active mutually exclusive. In some embodiments, the address bit used to generate the enable signal may arrive early enough (e.g., before the start of the clock cycle) to shutdown or deactivate the other wordline. Therefore, the array that is not enabled may be shutdown into a low power mode allowing the wordline and downstream components (e.g., bitlines, latches, sense amps, etc.) to likewise shutdown resulting in power savings.

In some embodiments, PA[12] may arrive before the start of the clock cycle and the respective wordline enable signals may likewise be received before the start of the clock cycle, or early enough in the clock cycle, such that one of the wordlines may be activated and the other wordline may be deactivated/disabled (or remain deactivated/disabled). Thus, the late arriving bit may arrive early enough in time such that the entire wordline may be shut down. As such, more power savings may be achieved by going to a low power mode for the wordlines, bitlines, sense amps, and other circuitry. As a result, components downstream of the bitlines may be pre-empted resulting in no switching in the shut down array, which may yield significant power savings.

In some embodiments, the independent controllability of the arrays, as described herein at FIGS. 9-10 may allow for one of the wordlines to be disabled while one wordline is enabled. Each array may include a number of wordline drivers. The wordline drivers for each respective array may receive a respective wordline enable signal. Each wordline enable signal or signal may be derived from an address bit of an address used to access the cache memory (e.g., PA[12]). In some embodiments, there are two wordlines, each with a respective wordline enable signal with the two wordline enable signals being active mutually exclusive. The output of a latch of one array may be coupled to an adjacent latch of another array. The coupled output may itself be coupled to logic/circuitry (e.g., NOR, tri-state, etc.) with the output of the latch of the activated wordline being selected at the logic. The correct output, and the correct cache line of data from the enabled array, may be selected with the same address bit of the address used to access the cache memory. In some embodiments, the selected output may be provided to an execution core of a processor implementing the cache memory. During operation, enabling a wordline driver may then activate a wordline and a number of columns including bitlines, sense amps, and other components downstream of the wordline for that particular wordline and array. Likewise, the wordline that is not enabled or activated may be deactivated along with its downstream components.

In various embodiments, the enabling one of the wordlines based on an address bit may be implemented in a data cache as well as in an instruction cache. In some embodiments, the wordline enable signals may be implemented in one type of cache and not the other, for instance, it may be implemented on an instruction cache and not a data cache.

For subsequent cache memory reads, the wordline enable may occur in similar fashion. For example, consider a first cache memory read in which a first array and second array of a cache memory receive a portion of an address (e.g., VA/PA [11:3]) used to access the cache memory before the start of a first clock cycle. The first wordline drivers may receive an asserted first wordline enable signal or signal and the second wordline drivers may receive a deasserted second wordline enable signal. The first wordline drivers may be activated in response to the asserted enable signal while the second wordline drivers may be deactivated (if they were previously active) or may remain deactivated. The first array may output a first cache line of data, which may be selectable using the same address bit used to generate the enable signals. Each of the first and second wordline enable signals may be derived from another portion of the address (e.g., PA[12], PA[13], etc.) used to access the cache memory, and may be active mutually exclusive. Thus, one of the enable signals may be asserted at a time and the other may be deasserted. In a next clock cycle, the second wordline may be activated while the first wordline may be deactivated resulting in the second array outputting the respective cache line via activated wordlines, bitlines, sense amps, etc. In various embodiments, the disabled wordline may be re-enabled after the end of a read cycle, for example, based on a timer or clock. Or in some embodiments, the disabled wordline may be disabled until it receives an asserted wordline enable signal. Thus, if four consecutive reads assert and activate the first wordline, the second wordline may remain disabled the entire time until it receives an asserted enable signal in which case the second wordline (and downstream components) may be activated in response to the asserted second wordline signal, according to some embodiments.

In one embodiment, because the array outputs are active mutually exclusive, output latches 920 may be output through a two input NOR gate 901 of output select logic 950, for example, rather than through a mux. Thus, the output data path may incur less or no additional delay, and may take up less area because there is no longer a mux in the output path. In addition, because only one array wordline may be active at a time, there may be a significant dynamic power savings as well. In FIG. 10, instead of outputting through a NOR gate or mux, the outputs may be dotted across the gap and tri-stated. In other non-illustrated embodiments, components of output select logic 950 and 1050, of the embodiments of FIGS. 9-10, and corresponding structural equivalents may be referred to as "means for selecting an output." In another embodiment, significant power savings may still be realized even if a mux is used, instead of tri-states or NOR gates, to select between arrays 915A and 915C, or 915B and 915D because there may still be only one wordline driver active in the one array selected by PA [12].

In one embodiment, the organization of the cache memory of FIGS. 9-10 is such that the basic building blocks of the cache memory such as the arrays 815, the control logic 930, etc. are available for configuration by providing different connections on the metallization layers of the integrated circuit design. For instance, in the embodiment of FIG. 8, the arrays 815A and 815B are interleaved and muxed at the output thereby creating a memory bank 810A in a vertical fashion. However, to create the horizontal banks 910A and 910B, the connections at metallization may be modified to make use of de-interleaved arrays 815A and 815C.

Figure 11:
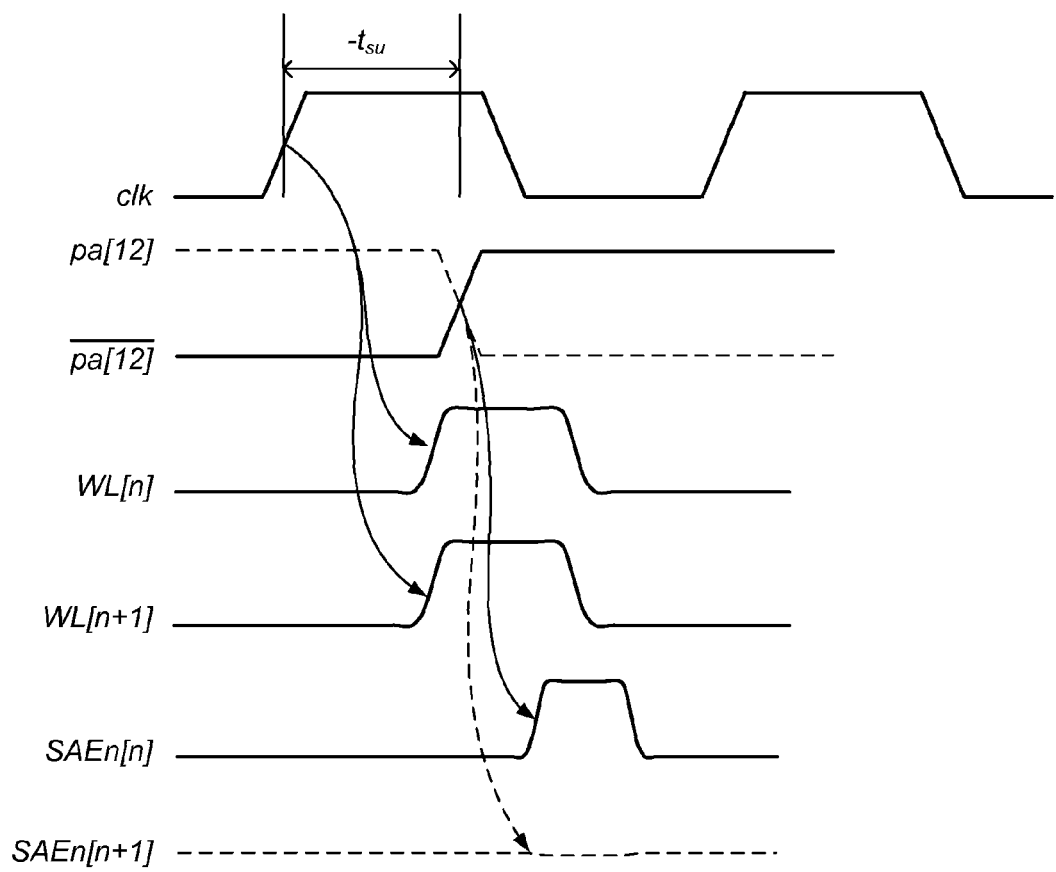
FIG. 11 is a timing diagram depicting example circuit timing of the embodiment shown in FIGS. 4-5.

Turning to FIG. 11, a timing diagram depicting example circuit timing of the embodiments of FIGS. 4-5 is shown. FIG. 11 shows a situation in which PA[12] arrives too late to shut down the entire wordline but is capable of shutting down one of the sense amplifiers. FIG. 11 includes a CLK signal, PA[12] signal, PA[12] inverted, first and second wordline enables WL[n] and WL[n+1], or WL odd and WL even, and first and second sense amp enable signals SAE[n] and SAE[n+1], or SAE odd and SAE even. Note that PA[12] arrives at a time $t_{su}$ after the start of the clock cycle. Both wordlines may be active based on the late arrival but one of the sense amps may be activated and the other may be deactivated (or just not be activated) according the embodiments of FIGS. 4-5. The non-activated sense amp may be quiescent and only receive I/O power, therefore remaining in a low power mode.

Figure 12:
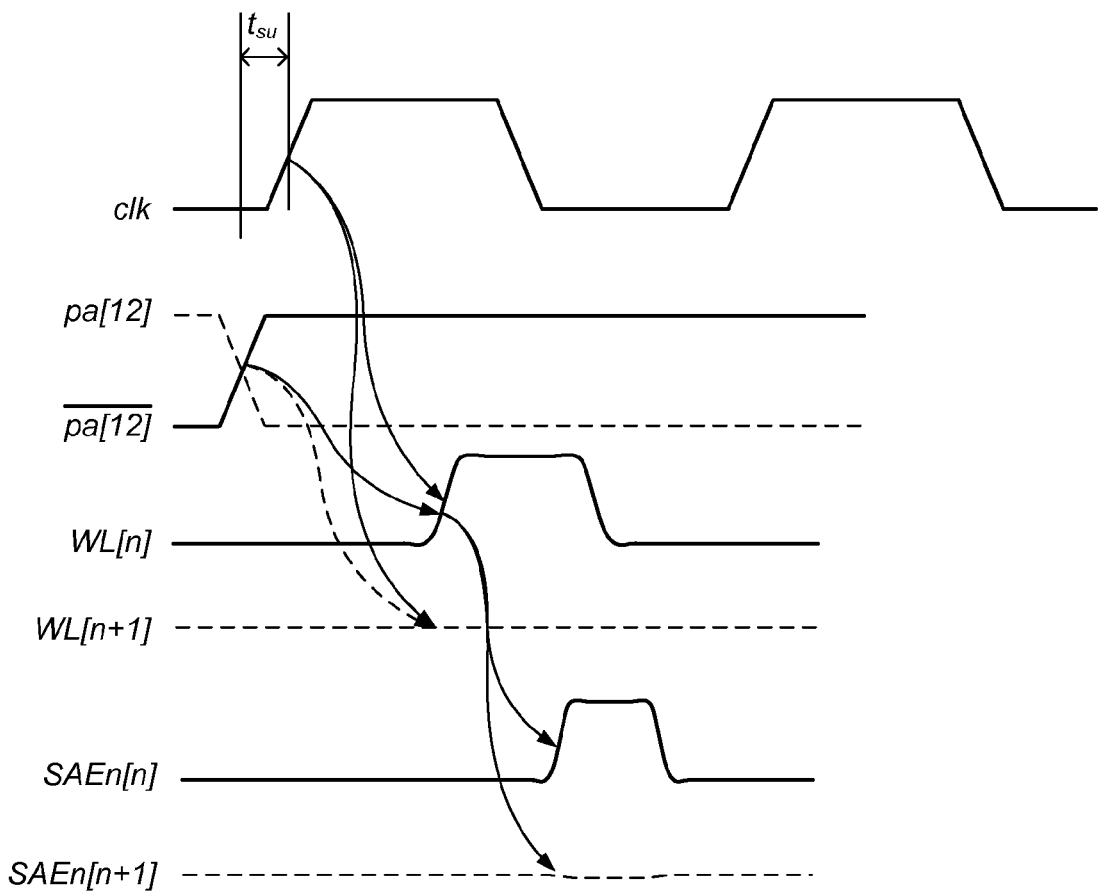
FIG. 12 is a timing diagram depicting example circuit timing of the embodiment shown in FIGS. 9-10.

FIG. 12 shows a situation in which PA[12] arrives sufficiently early enough to shut down one of the wordlines. FIG. 12 includes a CLK signal, PA[12] signal, the PA[12] inverted, first and second wordline enables WL[n] and WL[n+1], and first and second sense ample enable signals SAE[n] and SAE[n+1]. PA[12] and its inverse may arrive a time $t_{su}$ before the start of a clock cycle. As such, PA[12] may arrive early enough to shut down an entire wordline (i.e., only activating one of the arrays/wordlines). In the illustrated example, WL[n] is enabled based on PA[12] and WL[n+1] is disabled. Additionally, downstream bitlines (not shown) and sense amps (as shown) may likewise be shut down resulting in significant power savings without suffering much or any performance loss. Thus, in this example, bitlines, sense amps, and other components downstream of WL[n+1] may operate in low power modes thereby saving power.

Exemplary System

Figure 13:
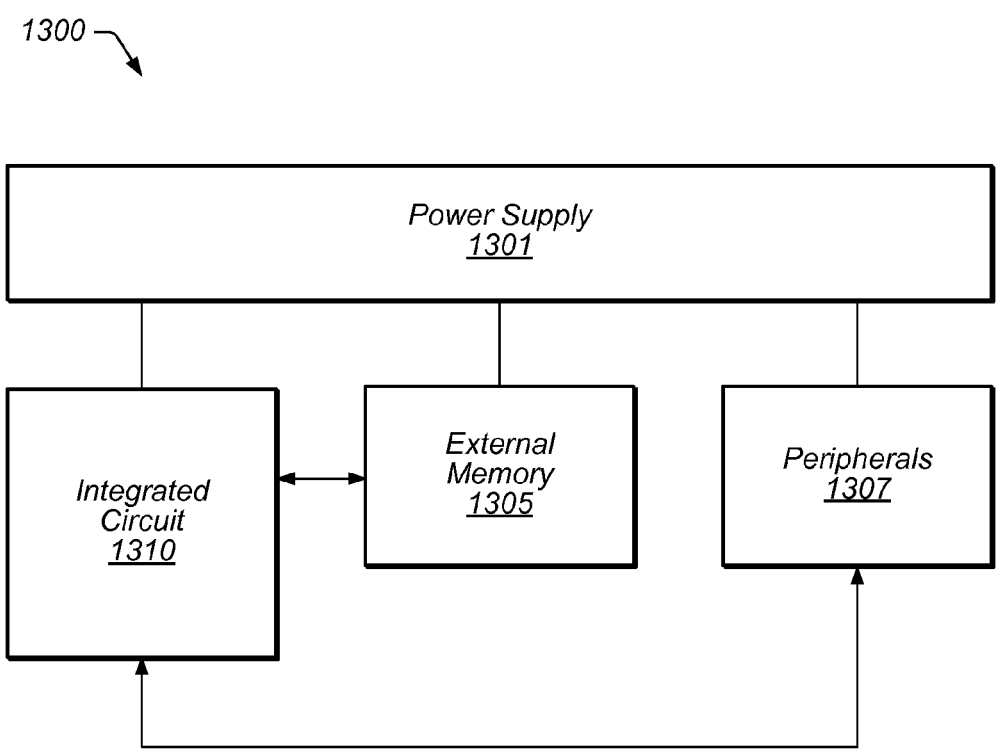
FIG. 13 is a block diagram of one embodiment of a system.

Turning to FIG. 13, a block diagram of one embodiment of a system is shown. The system 1300 includes at least one instance of an integrated circuit 1310 coupled to one or more peripherals 1307 and an external system memory 1305. The system 1300 also includes a power supply 1301 that may provide one or more supply voltages to the integrated circuit 1310 as well as one or more supply voltages to the memory 1305 and/or the peripherals 1307.

In the illustrated embodiment, the system 1300 includes at least one instance of an integrated circuit 1310. The integrated circuit 1300 may include one or more instances of the processor 10 (from FIG. 1). The integrated circuit 1300 may, in one embodiment, be a system on a chip including one or more instances of the processor 10 and various other circuitry such as a memory controller, video and/or audio processing circuitry, on-chip peripherals and/or peripheral interfaces to couple to off-chip peripherals, etc.

The peripherals 1307 may include any desired circuitry, depending on the type of system. For example, in one embodiment, the system 1300 may be included in a mobile device (e.g., personal digital assistant (PDA), smart phone, etc.) and the peripherals 1307 may include devices for various types of wireless communication, such as WiFi, Bluetooth, cellular, global positioning system, etc. The peripherals 1307 may also include additional storage, including RAM storage, solid-state storage, or disk storage. The peripherals 1307 may include user interface devices such as a display screen, including touch display screens or multitouch display screens, keyboard or other input devices, microphones, speakers, etc. In other embodiments, the system 1300 may be included in any type of computing system (e.g. desktop personal computer, laptop, workstation, net top etc.).

The external system memory 1305 may include any type of memory. For example, the external memory 1305 may be in the DRAM family such as synchronous DRAM (SDRAM), double data rate (DDR, DDR2, DDR3, etc.), or any low power version thereof. However, external memory 1305 may also be implemented in SDRAM, static RAM (SRAM), or other types of RAM, etc.

* * *

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:
1. A memory, comprising:
  a first array including a plurality of first wordline drivers; and a second array including a plurality of second wordline drivers;

wherein the plurality of first wordline drivers is configured to receive a first enable signal, and the plurality of second wordline drivers is configured to receive a second enable signal, wherein the first and the second enable signals are derived from an address bit of an address used to access the memory, and wherein the first and the second enable signals are active mutually exclusive.

2. The memory of claim 1, wherein the first and second arrays are odd and even arrays of a previously interleaved single array, respectively.

3. The memory of claim 1, wherein the output of a latch of the first array is coupled to the output of an adjacent latch of the second array, wherein the coupled output of the latch of the first array and output of the adjacent latch of the second array is coupled to a logic, wherein the coupled output is selectable in the logic by the same address bit of the address used to access the memory.

4. The memory of claim 1, wherein during operation, the first enable signal activates the plurality of first wordline drivers and wherein the second enable signal deactivates the plurality of second wordline drivers.

5. The memory of claim 4, wherein disabling the second array includes disabling a plurality of hardware components downstream of the plurality of second wordline drivers.

6. An apparatus, comprising:
a first wordline decoder for a plurality of first wordline drivers and a second wordline decoder for a plurality of second wordline drivers, wherein each wordline decoder is configured to receive a respective signal to activate, wherein the respective signals are active mutually exclusive;
a plurality of first cache array latches coupled to the plurality of first wordline drivers, wherein each first cache array latch is configured to output a first cache line of data; and
a plurality of second cache array latches coupled to the plurality of second wordline drivers, wherein each second cache array latch is configured to output a second cache line of data, wherein each of the plurality of first cache array latches is coupled to a corresponding one of the plurality of second cache array latches,
wherein an address bit of an address for accessing the first and second cache lines of data is usable to select whether to enable the first wordline decoder signal or to enable the second wordline decoder signal.

7. The apparatus of claim 6, wherein during operation, an enabled first wordline decoder signal activates the plurality of first wordline drivers, and wherein a disabled second wordline decoder signal deactivates the plurality of second wordline drivers when the plurality of second wordline drivers was previously activated.

8. The apparatus of claim 6, wherein an output of each coupled plurality of first cache array latches and an output of a corresponding one of the plurality of second cache array latches is selectable based on the same address bit of the address for accessing the first and second cache lines of data.

9. The apparatus of claim 6, wherein during operation, the first wordline decoder is enabled and wherein based on other bits of the address for accessing the first cache line not including the address bit, one of the plurality of first cache array latches outputs the first cache line of data, wherein the first cache line of data is selected from the coupled one of the plurality of first cache array latches and its corresponding one of the plurality of second cache array latches using the address bit.

10. The apparatus of claim 6, wherein a memory bank comprises a first array including the first wordline decoder, the plurality of first wordline drivers, the plurality of first cache array latches, and a second array comprising the second wordline decoder, the plurality of second wordline drivers, and the plurality of second cache array latches, wherein the first and second arrays are deinterleaved arrays connected in a metal layer across the memory bank.

11. A system, comprising:
a memory; and
one or more processors coupled to the memory, wherein at least one of the one or more processors includes a cache memory;
wherein the cache memory comprises:
a first array configured to output a first cache line of data, wherein the first array includes a plurality of first wordline drivers, and
a second array configured to output a second cache line of data, wherein the second array includes a plurality of second wordline drivers, wherein an output of the first array is coupled to an output of the second array,
wherein the plurality of first wordline drivers is configured to be enabled by a first enable signal, and wherein the plurality of second wordline drivers is configured to be enabled by a second enable signal,
wherein the first and the second enable signals are derived from a single address bit of an address used to access the cache memory, and
wherein the first and the second enable signals are active mutually exclusive.

12. The system of claim 11, wherein during a period in which the first enable signal is asserted, the plurality of first wordline drivers is activated and configured to output the first cache line of data to an execution core of the at least one of the one or more processors, wherein during the same period, the plurality of second wordline drivers and the second array are deactivated.

13. The system of claim 11, wherein other bits of the address used to access the cache memory, excluding the single address bit, are provided to the first and second arrays to retrieve the first cache line of data and second cache line of data, respectively, wherein the first and second cache lines of data differ in at least one bit of data.

14. The system of claim 11, wherein during operation, the single address bit of the address used to access the cache memory is received early enough in a clock cycle to derive the first and second enable signals and activate one of the plurality of wordline drivers based on which of the first or second enable signals is asserted.

15. The system of claim 11, wherein the first enable signal is the single address bit of the address and wherein the second enable signal is an inverse of the single address bit of the address.

16. A method, comprising:
before a start of a clock cycle:
a first array and second array of a memory receiving a portion of an address, wherein the first array includes a plurality of first wordline drivers and wherein the second array includes a plurality of second wordline drivers;
the plurality of first wordline drivers receiving an asserted first wordline enable signal without the plurality of second wordline drivers receiving an asserted second wordline enable signal, wherein the first and second wordline enable signals are derived from an address bit of the address that is separate from the portion of the address received by the first and second arrays, and wherein the first and second wordline enable signals are active mutually exclusive; and the plurality of first wordline drivers activating in response to the asserted first wordline enable signal and the plurality of second wordline drivers deactivating in response to not receiving the asserted second wordline enable signal.

17. The method of claim 16, further comprising selecting an output of the first array by a select signal derived from the address bit, wherein the output of the first array is coupled to an output of the second array.

18. The method of claim 16, wherein each of the select signal is the address bit, the first wordline enable signal is the address bit, and the second wordline enable signal is an inversion of the address bit.

19. The method of claim 16, further comprising:
before a start of a next clock cycle:
the first array and second array receiving a portion of another address;
the plurality of second wordline drivers receiving an asserted second wordline enable signal and the plurality of first wordline drivers receiving a deasserted first wordline enable signal;
activating the plurality of second wordline drivers in response to receiving the asserted second wordline enable signal and deactivating the plurality of first wordline drivers; and
the second array outputting a second line of data, wherein the second line of data is selectable by a select signal derived from an address bit of the another address that is separate from the portion of the another address received by the first and second arrays.

20. The method of claim 19, wherein the first and second arrays are odd and even deinterleaved arrays, respectively.

* * * * *